US007906957B2

(12) United States Patent
Tarchinski et al.

(10) Patent No.: US 7,906,957 B2
(45) Date of Patent: Mar. 15, 2011

(54) HIGH VOLTAGE CONNECTOR AND METHOD HAVING INTEGRATED VOLTAGE MEASUREMENT PROBE POINTS

(75) Inventors: James E. Tarchinski, Rochester Hills, MI (US); Joseph Ciagala, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 280 days.

(21) Appl. No.: 12/274,384

(22) Filed: Nov. 20, 2008

(65) Prior Publication Data

US 2010/0123455 A1 May 20, 2010

(51) Int. Cl.
*G01R 1/06* (2006.01)

(52) U.S. Cl. ........................................ 324/149; 324/538

(58) Field of Classification Search ........................ None
See application file for complete search history.

(56) References Cited

U.S. PATENT DOCUMENTS 4,902,968 A * 2/1990 Sugimoto .................... 324/537
6,124,716 A * 9/2000 Kanamori ..................... 324/538
2006/0121773 A1* 6/2006 Ichikawa et al. .............. 439/408

* cited by examiner

*Primary Examiner* — Ha Tran T Nguyen
*Assistant Examiner* — Arleen M Vazquez
(74) *Attorney, Agent, or Firm* — Quinn Law Group, PLLC

(57) ABSTRACT

An electrical connector adapted for staged disassembly to test for high voltage includes a plug having an enclosed electrical terminal with a first opening exposing the terminal and a socket having another enclosed electrical terminal with an opening exposing the other terminal. The socket opening is substantially complementary to the first opening to receive the plug sufficiently into the socket to electrically engage the terminals in first and second positions. A port in one of the socket or plug provides access to one of the terminals in one of the positions but is obstructed from access to a terminal in the other of the positions. The port is small enough to prevent a finger from accessing a terminal but large enough to receive an electrical meter probe for voltage testing. A latch on the box portions positions the port in each of the two positions.

13 Claims, 2 Drawing Sheets

HIGH VOLTAGE CONNECTOR AND METHOD HAVING INTEGRATED VOLTAGE MEASUREMENT PROBE POINTS

TECHNICAL FIELD

This invention relates to a high voltage electrical connector and method configured and arranged to enable measurement while there is still engagement of electrical terminals.

BACKGROUND

In electrical systems, there is commonly the need to join electrically conductive materials to deliver power to components. One type of connection is by connectors containing electrical terminals. These terminals join the cable or wires, generally running from a power supply, such as a car battery or alternator, to other units or components to provide those components or units of the vehicle with power. When a high voltage cable is connected to such a unit within a vehicle, and the production line requires quality assurance tests or the system requires diagnostic work, there are added procedural complexities that delay testing and diagnosis of electrical issues with exposed terminals.

Many times during assembly of vehicles testing is more difficult because of the tight spaces required to access a connection in a fully separated configuration. Further, each such connection needs to be specifically designed for the particular installation or access while taking into account factors such as engineering, cost, production line assembly steps, and robotics.

SUMMARY

The present invention is directed to a connector apparatus that may remain connected while providing access for testing, diagnostics, and assembly.

The electrical connector is adapted for joining a first cable to a second cable and for staged disassembly to test for the presence of voltage. The connector comprises a socket, a plug, and a probe hole. The socket is characterized by an insulative protective socket case with a socket opening on one side exposing an electrically conductive socket terminal, enclosed therein, in electrical communication with the first cable. The plug is characterized by an insulative protective plug case, with a plug end on one side exposing an electrically conductive plug terminal enclosed therein, in electrical communication with the second cable. The socket case and plug case are configured with the respective opening and end facing each other to allow the socket and plug to mate for such electrical communication between the terminals. The probe hole extends through at least one of the socket case and the plug case. The connector is configured with a sealed position in which the socket case and plug case are sufficiently fully mated for such electrical communication, and the socket terminal and plug terminal are also in such electrical communication, and the probe hole is obstructed preventing access to the sufficiently mated terminals. The connector is also configured with a probe position in which the socket case and plug case are sufficiently partially mated for electrical communication, and the probe hole is sufficiently unobstructed to allow a probe tool to come into electrical communication with one of said socket and plug terminals.

An aspect of the invention also provides an electrical connector box which is adapted for staged disassembly to test for the presence of high voltage. It comprises a first box portion having a first terminal enclosed therein, and a first opening exposing the first terminal. It also comprises a second box portion having a second terminal enclosed therein and a second opening exposing the second terminal and substantially complementary to the first opening to receive the first box portion sufficiently into the second box portion to electrically engage the first and second terminals in first and second positions of engagement. The port in the second box portion is alignable with one of the first and second terminals when the first and second terminals are engaged in one of their positions of engagement and sufficiently small enough to prevent a human digit to intrude but sufficiently large enough to receive an electrical meter probe into electrical communication with the first terminal. There is a first latch portion on one of the box portions which is engageable with a keeper portion on the other of the box portions to position the port in a first alignment with respect to one of the first and second terminals so that a probe may test for the presence of high voltage when the first and second terminals are engaged in the one of the positions of engagement. There is a second latch portion on one of the box portions which is engageable with another keeper portion on the other of the box portions to position the port in a second position out of alignment with the one of the first and second terminals when the first and second terminals are engaged in the other of the positions of engagement.

An aspect of the invention also provides a method for measuring the voltage of a sealable and probable-position socket and plug connection which has respective first and second fastening mechanisms for determining the sealable and probable positions. The method comprises disengaging a first fastening mechanism; moving the plug from a sealed position to a probe position which is determined by the second fastening mechanism; measuring the voltage in the probe position; and moving the plug from the probe position to the sealed position.

An aspect of the invention also provides a method for measuring voltage by disassembling a multi-position socket and plug connection having respective first and second fastening mechanisms for determining sealable, probable, and open positions. The method comprises disengaging the first fastening mechanism; moving the multi-position plug from the sealed position to the probe position; measuring voltage; and disengaging the second fastening mechanism and moving the plug from the probe position to the open position when the measurement at the probe position shows no voltage.

An aspect of the invention also provides a method for making a physical voltage measurement of a high voltage circuit without risk. The method comprises providing an electrical connector with sequentially latchably matable high voltage terminals; latchably mating the high voltage terminals in electrically conductive communication with each other in first and second electrically conductive positions; exposing at least one of the high voltage terminals for making the physical measurement when the terminals are in one of the electrically conductive positions but not when the terminals are in the other one of the electrically conductive positions.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
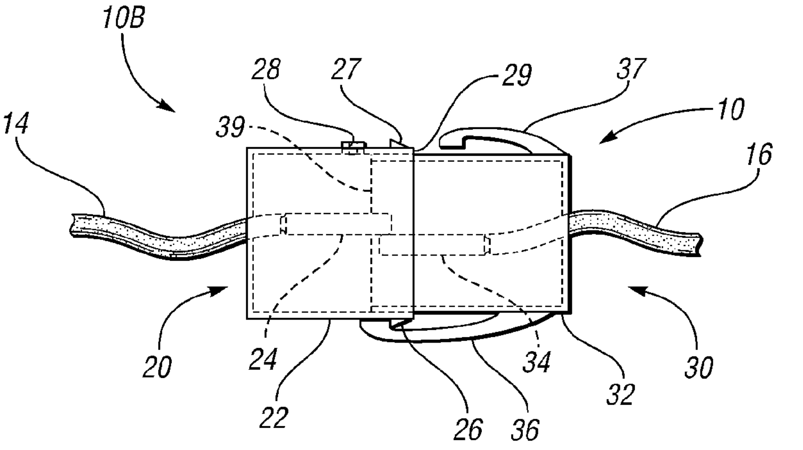
FIG. 1 shows a side elevational view of plug and socket portions of the connector in a partially open probe position of the connector to enable a voltage measurement in connected high voltage cables.
Figure 4:
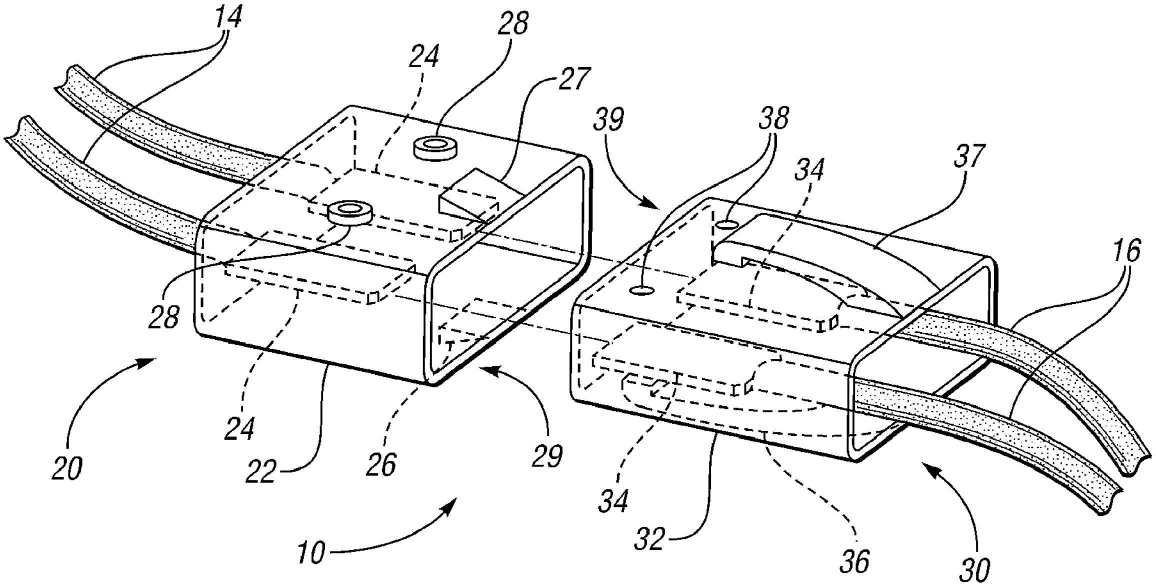
FIG. 4 shows an exploded side perspective view of the second embodiment of the connector showing the socket and plug portions in the open position and with holes on a leading end of an elongated plug portion all alignable with respective probe holes on the socket portion when the connector is in a probe position such as shown in FIG. 2B.

With reference to the drawings, FIGS. 1 and 4 show an electrical connector device 10 wherein the cables 14 and 16, are electrically connectible respectively to a corresponding socket or first box portion 20 and plug or second box portion 30 of the electrical connector 10. The socket portion 20 includes a socket case 22 which protects a socket terminal 24 from external contact. The socket terminal 24 of the socket case 22 is electrically connectible to a corresponding plug terminal 34 in the plug portion 30. The plug terminal 34 is likewise protected and supported by a corresponding plug case 32. When assembled, the plug case 32 fits snugly inside the socket case 22 with the large socket opening 29 and plug end 39 facing each other allowing the socket terminal 24 and plug terminal 34 to mate. Together the first and second box portions of the socket and plug provide an insulative protective characteristic to the electrical connector 10.

Figure 2A:
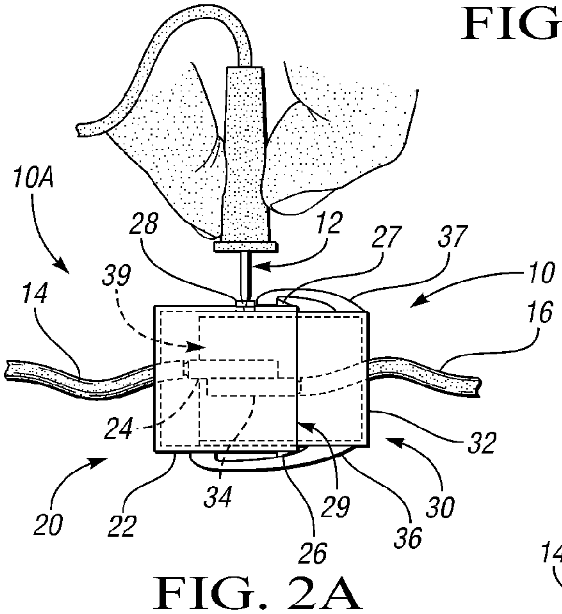
FIG. 2A shows a side view of the connector in a closed or sealed position wherein a multimeter probe is unable to make contact through a probe hole with a terminal on a cable for such measurement.
Figure 2B:
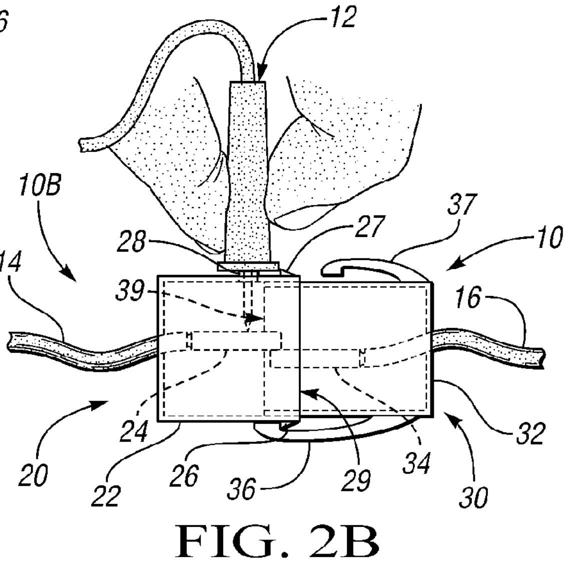
FIG. 2B shows a side view of the connector in the probe position with the multimeter probe making contact through the probe hole with the terminal to allow for reading of a measurement.

More particularly, the socket portion 20 has the socket terminal 24 enclosed therein, and a socket opening 29 which exposes the socket terminal 24. The plug portion 30 has a plug terminal 34 enclosed therein and a plug end 39 which exposes the plug terminal 34. The leading plug end 39 is substantially complementary to the socket opening 20 which receives the plug portion 30 sufficiently into the socket portion 20 to electrically engage said socket terminal 24 and plug terminal 34 in first and second positions of engagement, respectively called the sealed position and probe position, as shown in FIG. 2A and FIG. 2B respectively.

With reference to FIG. 1, which shows the socket 20 and plug 30 mated in a probe position 10B, the plug has two latch or bolt portions 36 and 37 on the exterior of the plug case 32. The socket has two hooks or keeper portions 26 and 27 which respectively mate with two latches 36 and 37 on the plug 30. Together, each bolt and keeper includes a fastening mechanism. The selection of which keeper and latch portion, i.e. the pair 26 and 36 or the pair 27 and 37, will be mated depends on whether the connector 10 is in the probe position 10B (see also FIG. 2B) or a sealed or closed position 10A (see also FIG. 2A).

With reference to FIG. 1, more particularly, a latch portion 36 on the plug 30 is engageable with a keeper portion 26 on the socket 20 to position the socket 20 and plug 30 in an alignment (see also FIG. 2B) with respect to the socket or plug terminals, 24 and 34 respectively. In that alignment of the probe position 10B, a multimeter probe or the like, henceforth called the probe tool 12, may measure electrical properties, such as to test for the presence of voltage, when the socket and plug terminals, 24 and 34 respectively, are still engaged via the probe hole 28 (see also FIG. 2B). Also, a second latch or bolt 37 on the plug 30 is engageable with another keeper portion 27 on the socket 20 to position a port or probe hole 28 out of alignment with a respective terminal 34 when the plug 30 and socket 20 are in a closed or sealed position 10A (shown in FIG. 2A).

With reference again to FIG. 1, the socket 20 contains the probe hole 28. This probe hole 28 is designed to be sufficiently small to accommodate a multimeter probe and nothing larger. This probe hole 28 is also located vertically above the socket or plug terminal, 24 or 34 respectively, to allow the complete length of the electrically conductive part of probe tool 12 to enter without exposing a substantial portion of the electrically conductive portion of the probe 12 at the exterior of the socket or plug case, 22 or 32 respectively. This probe hole 28 will allow a technician to insert a probe tool 12, such as those found on an ordinary multimeter, to measure various electrical properties, such as voltage, at the socket terminal 24 and plug terminal 34 while still allowing an electrical connection between the two and without exposing the terminals to contact with external items. More particularly, a latch 37 on the plug 30 is engageable with a keeper 27 on the socket 20 to position probe hole 28 in coaxial alignment with the engaged terminal 24 so as to allow the probe tool 12 to enter while preventing entry of external items larger then the probe tool 12, and while still allowing the socket terminal 24 and plug terminal 34 to be engaged.

FIG. 2A shows the socket 20 and plug 30 in the closed position 10A in which the top hook or keeper 27 and top latch 37 are used to hold the socket case 22 and plug case 32 together. Also in this position the probe hole 28 is blocked or obstructed by the plug case 32. Unlike the probe position 10B illustrated in FIG. 1 and FIG. 2B, in the FIG. 2A position 10A the obstruction of the plug case prevents any contact of probe 12 with the socket terminal 24 and plug terminal 34. More particularly, a latch 37 on the plug 30 is engageable with a keeper 27 on the socket 20 to position probe hole 28 in blocking alignment with the plug case 32 to prevent any external items from entering via the probe hole 28 or via the socket opening 29 at plug end 39 while still allowing the socket terminal 24 and plug terminal 34 to be fully engaged.

FIG. 2B shows the connection in the probe position 10B. It illustrates a staged progression from the closed position 10A as shown in FIG. 2A. In the probe position 10B the bottom hook or keeper 26 and the bottom latch 36 are used to hold the socket case 22 and plug case 32 together. Also in this probe position 10B, the probe hole 28 is not blocked by the plug case 32. Hence a probe tool 12 can enter through the probe hole 28 and make contact with the mated socket terminal 24 and plug terminal 34. More particularly, the connector 10 is configured with a probe position 10B in which the socket case 22 and plug case 32 are sufficiently partially mated to maintain electrical communication between the socket terminal 24 and plug terminal 34, and the probe hole 28 is sufficiently unobstructed to allow a probe tool 12 to engage such electrical communication with one of the mated socket terminals 24 and plug terminals 34.

Figure 2C:
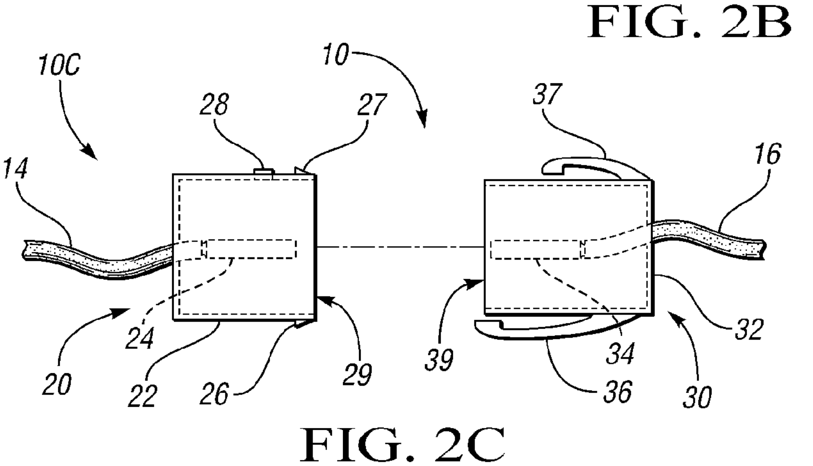
FIG. 2C shows a side exploded view of the connector with the plug and socket portions separated in a fully open position.

FIG. 2C shows a completely open or separated position 10C in which the socket 20 and plug 30 are not electrically connected and the socket case 22 and plug case 32 are not mated. Hence, the socket terminal 24 and plug terminal 34 are not in electrical communication. In this position both terminals are exposed but not electrically connected. This is shown for illustrative purposes as this position would be required when a technician is changing or replacing components.

Figure 3:
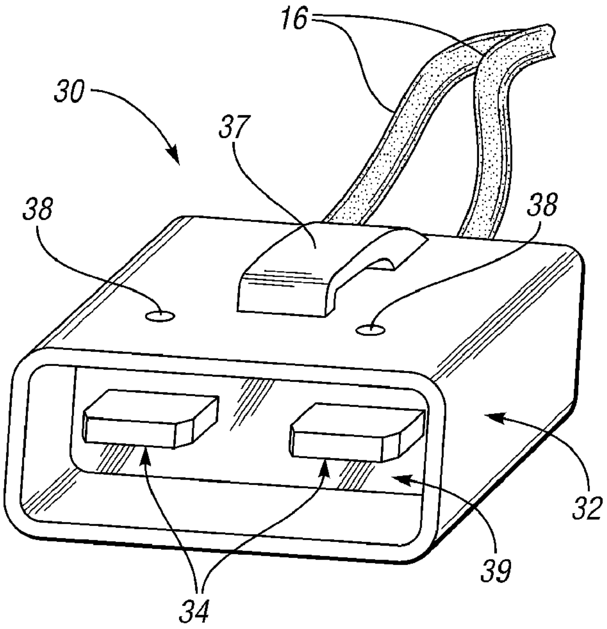
FIG. 3 shows a front perspective view of the plug portion in a second embodiment of the invention.

FIG. 3 shows an exemplary plug 30 in a perspective view of a second embodiment having a variation of the plug 30 shown in FIGS. 1, 2A, 2B, and 2C. In FIG. 3, the plug 30 is shown with an elongated plug end 39. Inside the plug end 39, which is formed by the plug case 32, each plug terminal 34 is visible and is in electrical communication with the wire or cable 16 coming from the rear. Also, only the top plug latch 37 is visible in this view as the bottom plug latch 36 is located out of sight on the underside of the plug 30 as seen in phantom in FIG. 4. More particularly, the leading end of plug 30 is altered to have two plug probe holes 38 which are configured to match and align with the corresponding socket probe holes 28 when the socket 20 and plug 30 are in a probe position 10B such as shown in FIG. 2B. These two plug holes 38 are also configured not to match nor align with the corresponding socket holes 28 when the socket 20 and plug 30 are in a sealed position 10A such as shown in FIG. 2A. This hole arrangement allows the socket hole 28 to continue to be obstructed by the plug case 32 as previously described when referring to FIG. 2A.

FIG. 4 shows an exemplary socket 20 and exemplary plug 30 of the second embodiment in the open or separated position from a perspective side view. This plug 30 contains the two probe holes 38. In this view it is easy to visualize how measuring voltage, for example, would be facilitated by moving the socket 20 and plug 30 from sealed position 10A (FIG. 2A) to a probe position 10B (FIG. 2B) by disengaging a first fastening mechanism or latch 37 from the keeper 27. In doing so, the probe position 10B (FIG. 2B) is determined by the second fastening mechanism or latch 36 and keeper 26. This would also bring the socket probe holes 28 into alignment with the plug holes 38. Then one can make measurements, such as voltage, in the probe position 10B (FIG. 2B) by inserting a probe tool 12 (such as shown in FIG. 2B) sufficiently that the probe tool 12 goes through a socket hole 28 and a plug hole 38 to make contact with the mated socket terminal 24 and plug terminal 34. After making a measurement, the plug 30 can be moved from a probe position 10B (FIG. 2B) back to a sealed position 10A (FIG. 2A) causing latch 37 to reengage with keeper 27. Alternatively, when the connector is in a probe position 10B (FIG. 2B), after taking a measurement, one could disengage the latch 36 and keeper 26 and separate the socket 20 and plug 30 to the position shown in FIG. 4 as necessary for maintenance or disassembly.

An aspect of the invention provides a method for making an improved physical voltage measurement. The method comprises providing an electrical connector 10 with sequentially latchably matable socket 20 and plug 30 each with respective internal high voltage terminals 24 and 34 (FIG. 2A and 2B). Then latchably mating the high voltage terminals 24 and 34 in electrically conductive communication with each other in first and second electrically conductive positions (FIG. 2A and FIG. 2B respectively). Finally, exposing at least one of the high voltage terminals 24 or 34 via a probe hole 28, for making the physical measurement when the terminals are in one of the electrically conductive positions (FIG. 2B), but not when the terminal is in the other one of the electrically conductive positions (FIG. 2A). The method may also be practiced with probe holes in both socket and plug (FIG. 4).

Another aspect of this invention provides a method for measuring voltage by disassembling a multi-position socket 20 and plug 30 connection having respective first fastening mechanisms, 27 and 37, and second fastening mechanisms, 26 and 36, for determining sealable 10A, probe 10B, and open positions 10C by disengaging the first fastening mechanisms 27 and 37, then moving the multi-position plug 30 from the sealed position 10A to the probe position 10B. In the probe position 10B, a probe tool 12 can measure voltage via the probe hole 28. Finally, when the measurement by the probe tool 12 at the probe position 10B showed no voltage, disengaging the second fastening mechanisms, 26 and 36, and moving the plug 30 allows transformation from the probe position 10B to the open position 10C. This aspect of the invention may also be practiced with probe holes in both socket and plug (FIG. 4).

The previously described versions of the present invention have many advantages, including being able to assemble, test, and maintain high voltage cables while reducing risk of shorts. But the invention does not require that all the advantageous features and all the advantages need to be incorporated into every embodiment of the invention.

Although the present invention has been described in considerable detail with reference to certain preferred versions thereof, other versions are possible. Therefore, the spirit and scope of the appended claims should not be limited to the description of the preferred versions contained herein.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

While the best modes for carrying out the invention have been described in detail, those familiar with the art to which this invention relates will recognize various alternative designs and embodiments for practicing the invention within the scope of the appended claims.

The invention claimed is:

1. An electrical connector, for joining a first cable to a second cable, and adapted for staged disassembly to test for the presence of voltage comprising:

a socket, characterized by an insulative protective socket case with a socket opening on one side exposing an electrically conductive socket terminal, enclosed therein, in electrical communication with the first cable;

a plug, characterized by an insulative protective plug case, with a plug end on one side exposing an electrically conductive plug terminal enclosed therein, in electrical communication with the second cable;

wherein, the socket case and plug case are configured with the respective socket opening and plug end facing each other to allow the socket and plug to mate for such electrical communication between the terminals;

wherein, a probe hole is defined through at least one of the socket case and the plug case;

wherein the connector is configured to enable engagement of the plug and socket in a sealed position in which the socket case and plug case are sufficiently fully mated for such electrical communication, and the socket terminal and plug terminal are in such electrical communication, and the probe hole is obstructed preventing access to the sufficiently mated terminals; and wherein the connector is configured to enable engagement of the plug and socket in a probe position in which the socket case and plug case are sufficiently partially mated for such electrical communication, and the probe hole is sufficiently unobstructed to allow a probe tool to come into electrical communication with one of said socket and plug terminals.

2. The connector of claim 1, wherein the plug case fits inside the socket case.

3. The connector of claim 1, wherein the connector is positionable in an open position in which the socket case and plug case are not mated and the socket terminal and plug terminal are not in electrical communication.

4. The connector of claim 1, wherein:

the probe hole is defined through a portion of the socket case;

the connector is further configured such that in said sealed position the socket probe hole is obstructed by the plug case; and the probe position is further configured such that the socket probe hole is unobstructed by the plug case.

5. The connector of claim 1, wherein:

the probe hole is defined through a portion of the plug case;

the connector is further configured in said sealed position such that the plug probe hole is obstructed by the socket case; and the connector is configured to enable engagement of the plug and socket in the probe position such that the plug probe hole is unobstructed by the socket case.

6. The connector of claim 1, where the probe hole includes both a socket probe hole and a plug probe hole:

the connector is configured to enable engagement of the plug and socket in the sealed position such that the socket probe hole and plug probe hole are sufficiently out of alignment to prevent a probe tool from passing through both and coming into electrical communication with the mated terminals; and the connector is configured to enable engagement of the plug and socket in the probe position such that the socket probe hole and plug probe hole are sufficiently coaxially aligned to allow a probe tool to pass through both holes and come into electrical communication with the mated terminals.

7. The connector of claim 1, wherein said first cable and second cable carry current and voltage high enough for use in an electric automotive vehicle.

8. The connector of claim 1, wherein the socket case and plug case have substantially a box shape.

9. The connector of claim 1, wherein the probe hole is sized sufficiently large to allow a standard multimeter probe.

10. The connection of claim 9, wherein the probe hole is sized sufficiently small to prevent a human digit from entering.

11. The connector of claim 1, further comprising:

a latch mechanism configured to hold said plug inside said socket in such sealed and probe positions;

wherein said latch mechanism is configured to allow the socket and plug to selectively move between the sealed position and the probe position, and to selectively move between the probe position and an open position wherein the socket and the plug are completely separated, but not to move directly from the sealed position to the separated position.

12. The connector of claim 11, wherein the latch mechanism includes at least one latch bolt and at least one keeper on a respective socket and plug.

13. An electrical connector box adapted for staged disassembly to test for the presence of high voltage comprising:

a first box portion having a first terminal enclosed therein, and a first opening exposing the first terminal;

a second box portion having a second terminal enclosed therein and a second opening exposing said second terminal and substantially complementary to said first opening to receive said first box portion sufficiently into said second box portion to electrically engage said first and second terminals in first and second positions of engagement;

a port defined in said second box portion alignable with one of said first and second terminals when said first and second terminals are engaged in one of their positions of engagement and sufficiently small enough to prevent a human digit to intrude but sufficiently large enough to receive an electrical meter probe into electrical communication with said first terminal;

a first latch portion on one of said box portions and engageable with a keeper portion on the other of said box portions to position said port in a first alignment with respect to one of said first and second terminals so that a probe may test for the presence of high voltage when said first and second terminals are engaged in said one of said positions of engagement; and a second latch portion on one of said box portions and engageable with another keeper portion on the other of said box portions to position said port in a second position out of alignment with said one of said first and second terminals when said first and second terminals are engaged in the other of said positions of engagement.

* * * * *